US008952458B2

United States Patent
Lee et al.

(10) Patent No.: US 8,952,458 B2
(45) Date of Patent: Feb. 10, 2015

(54) GATE DIELECTRIC LAYER HAVING INTERFACIAL LAYER AND HIGH-K DIELECTRIC OVER THE INTERFACIAL LAYER

(75) Inventors: Wei-Yang Lee, Taipei (TW); Xiong-Fei Yu, Hsinchu (TW); Da-Yuan Lee, Jhubei (TW); Kuang-Yuan Hsu, Fongyuan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 322 days.

(21) Appl. No.: 13/086,491

(22) Filed: Apr. 14, 2011

(65) Prior Publication Data

US 2012/0261758 A1   Oct. 18, 2012

(51) Int. Cl.
*H01L 21/70* (2006.01)
*H01L 21/02* (2006.01)
*H01L 21/8238* (2006.01)
*H01L 29/423* (2006.01)
*H01L 21/28* (2006.01)
*H01L 29/51* (2006.01)
*H01L 29/66* (2006.01)

(52) U.S. Cl.
CPC .. *H01L 21/823857* (2013.01); *H01L 29/42368* (2013.01); *H01L 21/28185* (2013.01); *H01L 29/513* (2013.01); *H01L 29/66545* (2013.01)
USPC ........... 257/368; 257/395; 257/405; 257/406; 257/E21.625; 257/E21.639; 257/E29.133

(58) Field of Classification Search
CPC ............... H01L 29/42364; H01L 29/42368; H01L 29/42384; H01L 21/823857; H01L 29/513
USPC .......... 257/288, 368, 402, 405, 406, E21.276, 257/310, E29.133, 369, 395, E21.639, 257/E21.625
See application file for complete search history.

(56) References Cited

U.S. PATENT DOCUMENTS

| | | | |
|---|---|---|---|
| 6,287,956 B2 * | 9/2001 | Yokoyama et al. | 438/624 |
| 6,407,435 B1 * | 6/2002 | Ma et al. | 257/411 |
| 6,867,454 B2 | 3/2005 | Hattori | |
| 7,893,502 B2 * | 2/2011 | Li et al. | 257/369 |
| 8,187,943 B2 | 5/2012 | Cascio et al. | |
| 2003/0052333 A1 * | 3/2003 | Mistry | 257/192 |
| 2003/0109090 A1 | 6/2003 | Bertin et al. | |
| 2003/0141559 A1 * | 7/2003 | Moscatelli et al. | 257/406 |
| 2004/0046219 A1 * | 3/2004 | Ueno et al. | 257/412 |
| 2008/0128808 A1 * | 6/2008 | Yamazaki et al. | 257/347 |
| 2008/0135953 A1 * | 6/2008 | Siprak | 257/411 |
| 2010/0006928 A1 * | 1/2010 | Pan et al. | 257/330 |

FOREIGN PATENT DOCUMENTS

| | | |
|---|---|---|
| CN | 1725507 | 1/2006 |
| CN | 1965403 | 5/2007 |
| CN | 101626033 | 1/2010 |

* cited by examiner

*Primary Examiner* — Jesse Y Miyoshi
(74) *Attorney, Agent, or Firm* — Lowe Hauptman & Ham, LLP

(57) ABSTRACT

A semiconductor device includes a substrate having a first active region, a first gate structure over the first active region, wherein the first gate structure includes a first interfacial layer having a convex top surface, a first high-k dielectric over the first interfacial layer, and a first gate electrode over the first high-k dielectric.

21 Claims, 9 Drawing Sheets

GATE DIELECTRIC LAYER HAVING INTERFACIAL LAYER AND HIGH-K DIELECTRIC OVER THE INTERFACIAL LAYER

FIELD OF THE INVENTION

The invention relates to integrated circuit fabrication and, more particularly, to a semiconductor device with a gate dielectric layer.

BACKGROUND

The semiconductor integrated circuit (IC) industry has experienced rapid growth. Technological advances in IC materials and design have produced generations of ICs where each generation has smaller and more complex circuits than the previous generation. As the dimensions of transistors decrease, the thickness of the gate dielectric layer must be reduced to maintain performance with the decreased gate length. However, in order to reduce gate leakage, high dielectric constant (high-k) gate dielectrics are used which allow greater physical thicknesses while maintaining the same effective thickness as would be provided by a gate dielectric layer used in future technology nodes. The gate dielectric layer further comprises an interfacial layer to reduce damage between the high-k gate dielectric and a silicon substrate.

However, there are challenges to implement such features and processes in complementary metal-oxide-semiconductor (CMOS) fabrication. As the gate length and spacing between devices decrease, these problems are exacerbated. For example, it is difficult to achieve a stable threshold voltage for an Input/Output (I/O) device because thickness variations of the gate dielectric layer causes shifts in the threshold voltage of the I/O device, thereby increasing the likelihood of device instability and/or device failure.

SUMMARY

In one embodiment, a semiconductor device comprises a substrate having a first active region; a first gate structure over the first active region, wherein the first gate structure comprises a first interfacial layer having a convex top surface; a first high-k dielectric over the first interfacial layer; and a first gate electrode over the first high-k dielectric.

In another embodiment, a semiconductor device comprises a substrate having a first active region; a first gate structure over the first active region, wherein the first gate structure comprises a first interfacial layer having a convex top surface; a first high-k dielectric over the first interfacial layer; a first gate electrode over the first high-k dielectric; a second gate structure over a second active region, wherein the second gate structure comprises a second interfacial layer having a concave top surface; a second high-k dielectric over the second interfacial layer; and a second gate electrode over the second high-k dielectric.

In still another embodiment, a method for fabricating a gate dielectric layer comprises forming an interfacial layer over a substrate; forming a high-k dielectric on the interfacial layer; and performing a fluorine-containing plasma treatment on the high-k dielectric and interfacial layer.

A detailed description is given in the following embodiments with reference to the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
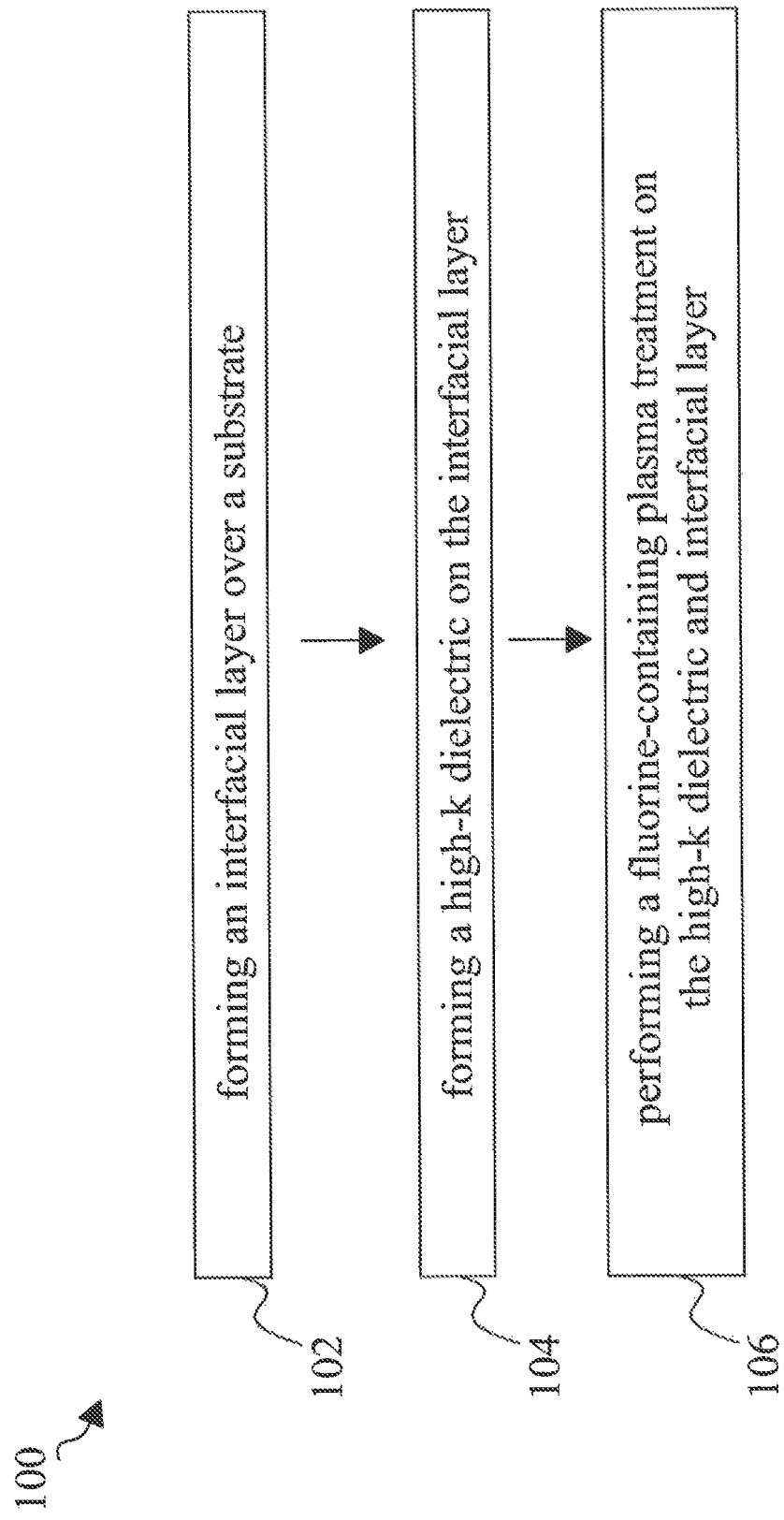
FIG. 1 is a flowchart illustrating a method for fabricating a gate dielectric layer according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Referring to FIG. 1, illustrated is a flowchart of a method 100 of fabricating a gate dielectric layer according to various aspects of the present disclosure. The method 100 begins with step 102 in which an interfacial layer is formed over a substrate. The method 100 continues with step 104 in which a high-k dielectric is formed on the interfacial layer. The method 100 continues with step 106 in which a fluorine-containing plasma treatment is performed on the high-k dielectric and interfacial layer. The discussion that follows illustrates an embodiment of a gate dielectric layer that can be fabricated according to the method 100 of FIG. 1.

Figure 2A:
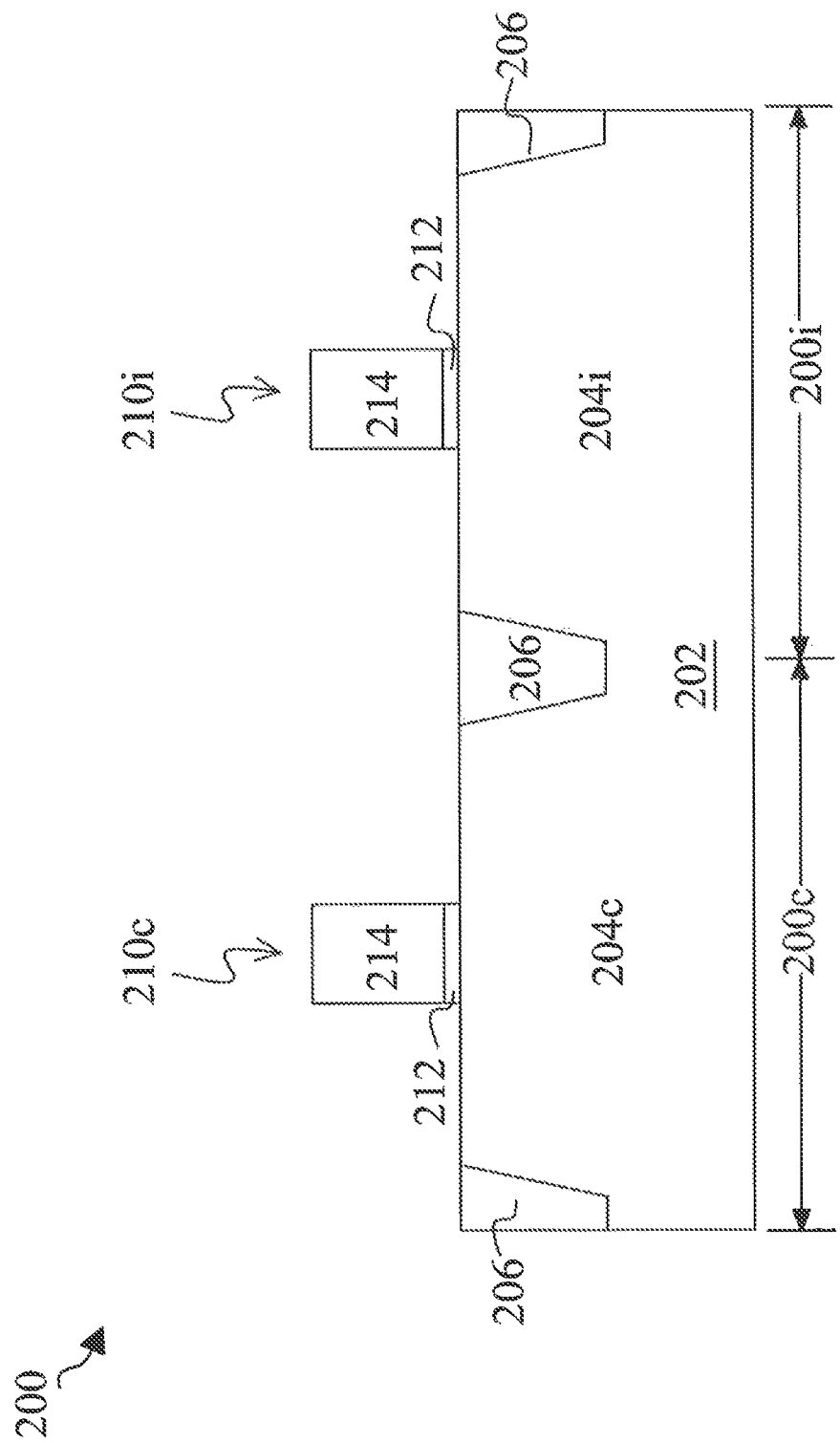
FIGS. 2A-H show schematic cross-sectional views of a gate dielectric layer of a semiconductor device at various stages of fabrication according to various aspects of the present disclosure.
Figure 2B:
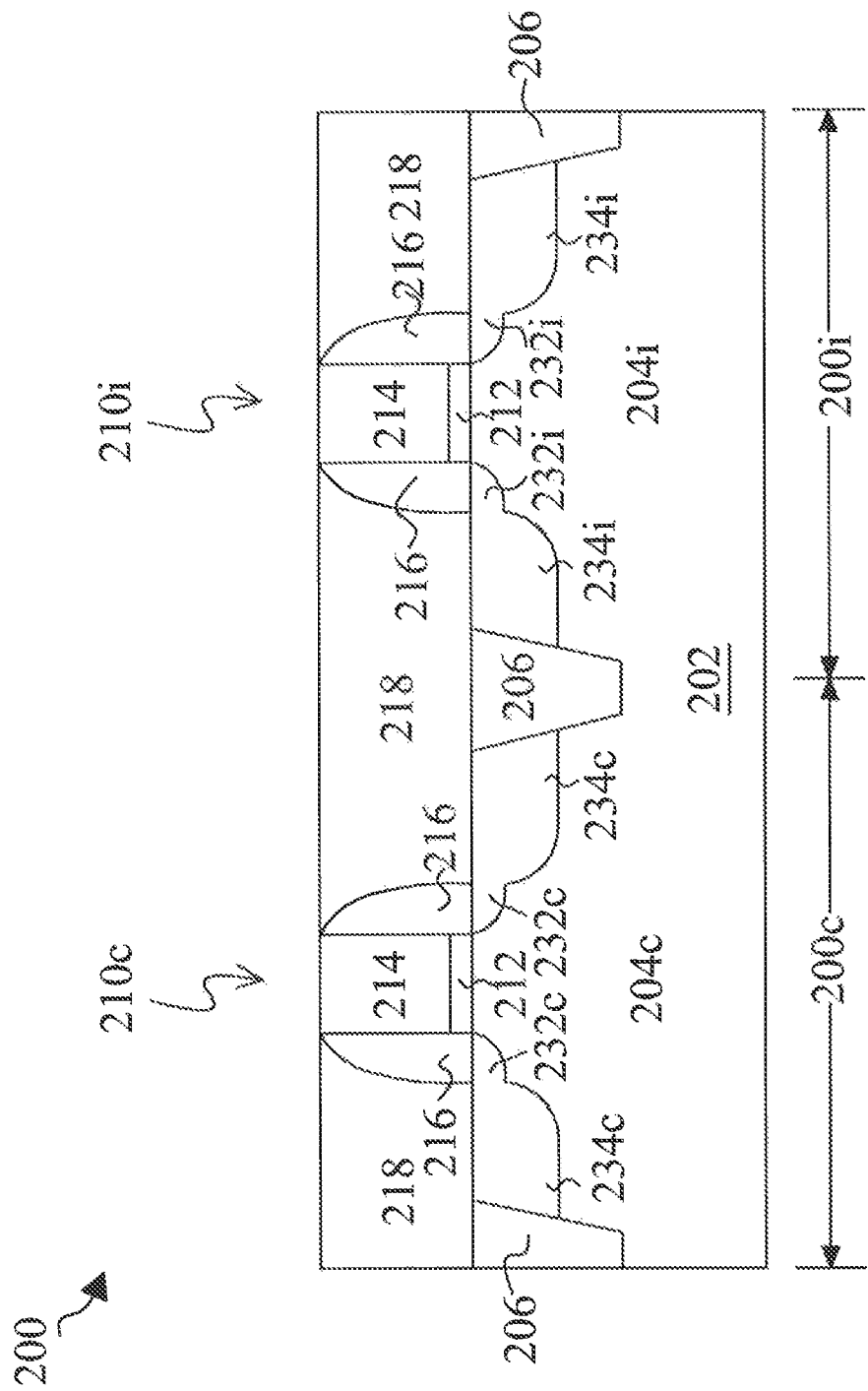
Figure 2C:
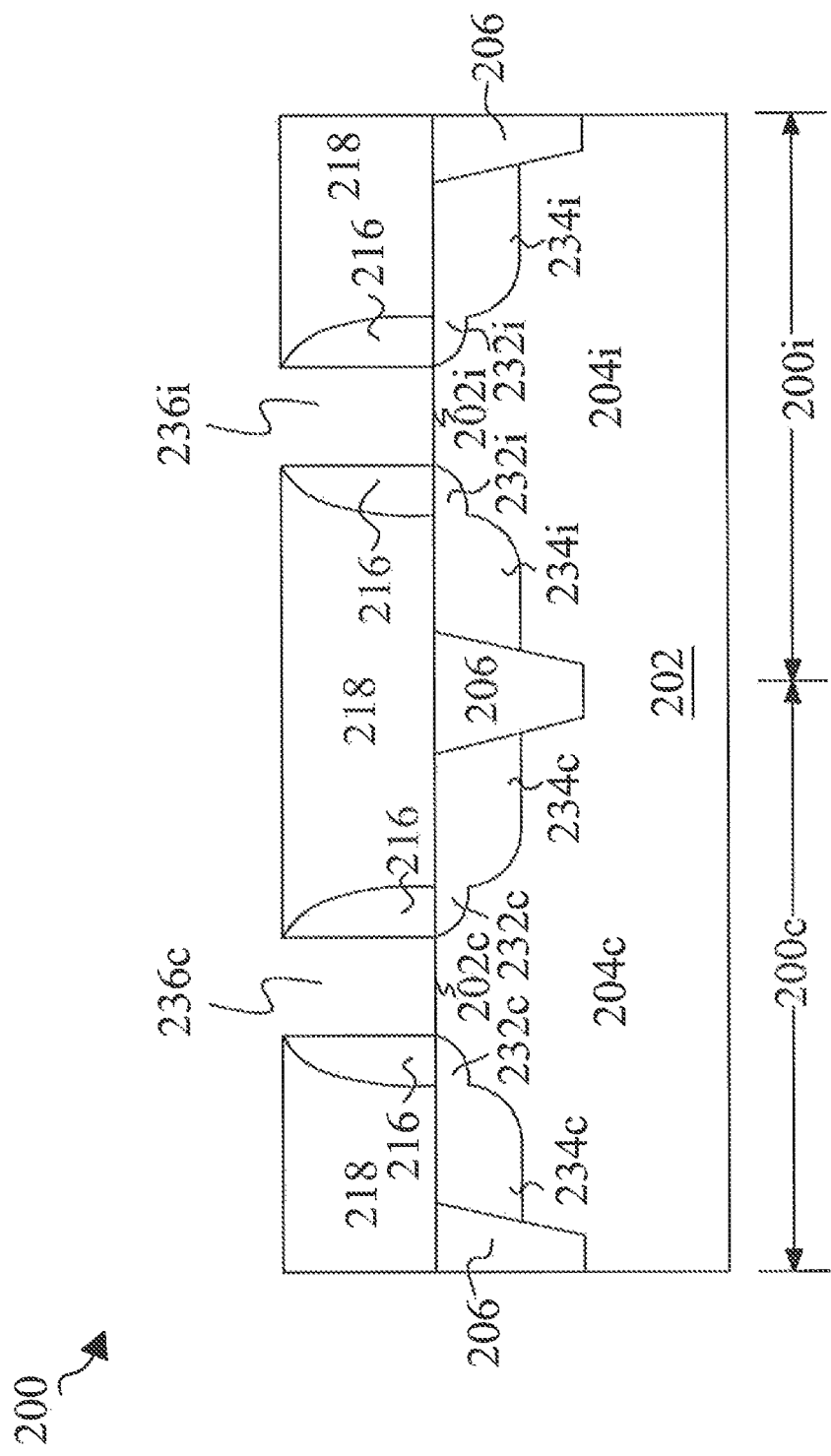
Figure 2D:
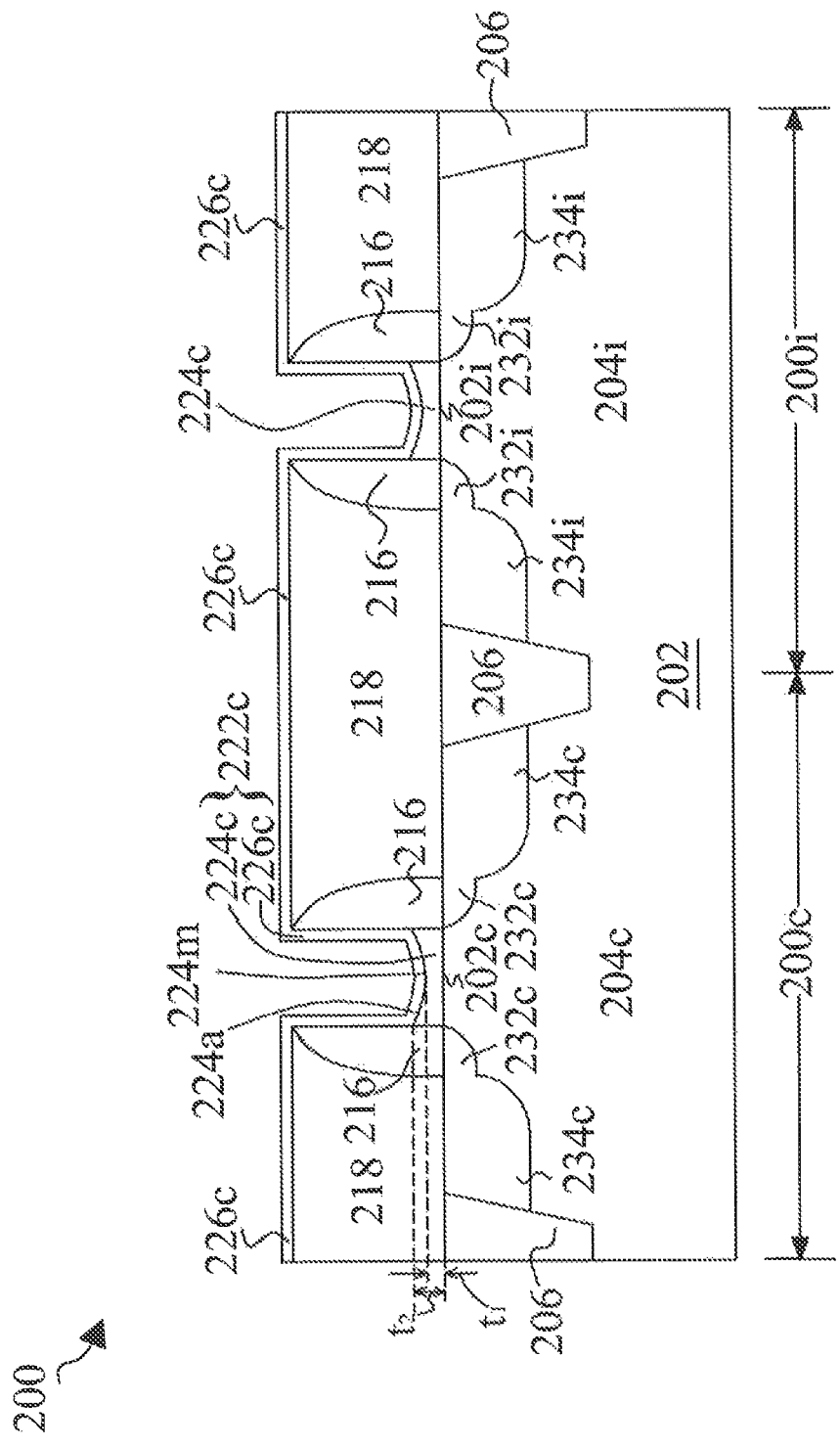
Figure 2E:
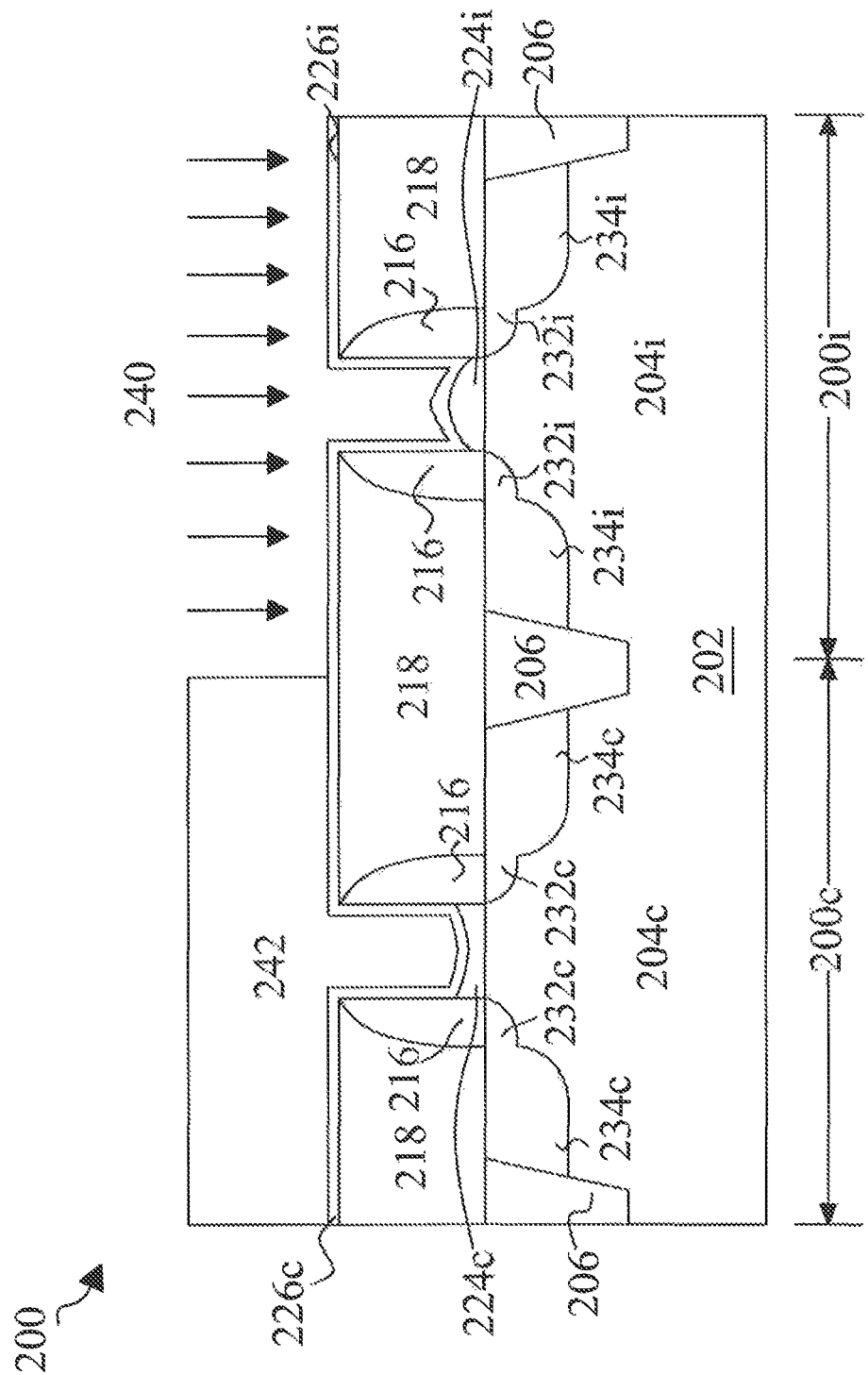
Figure 2F:
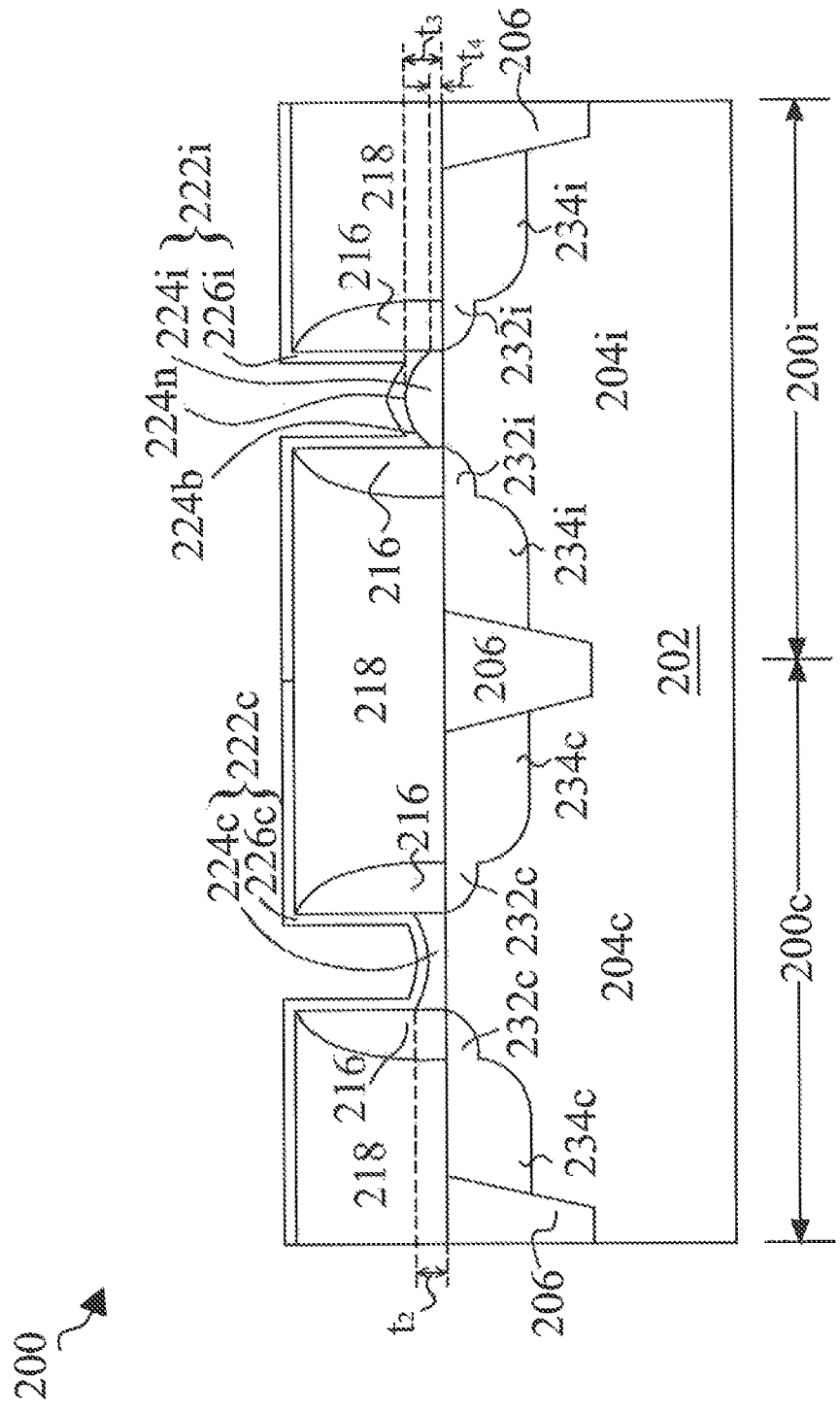
Figure 2G:
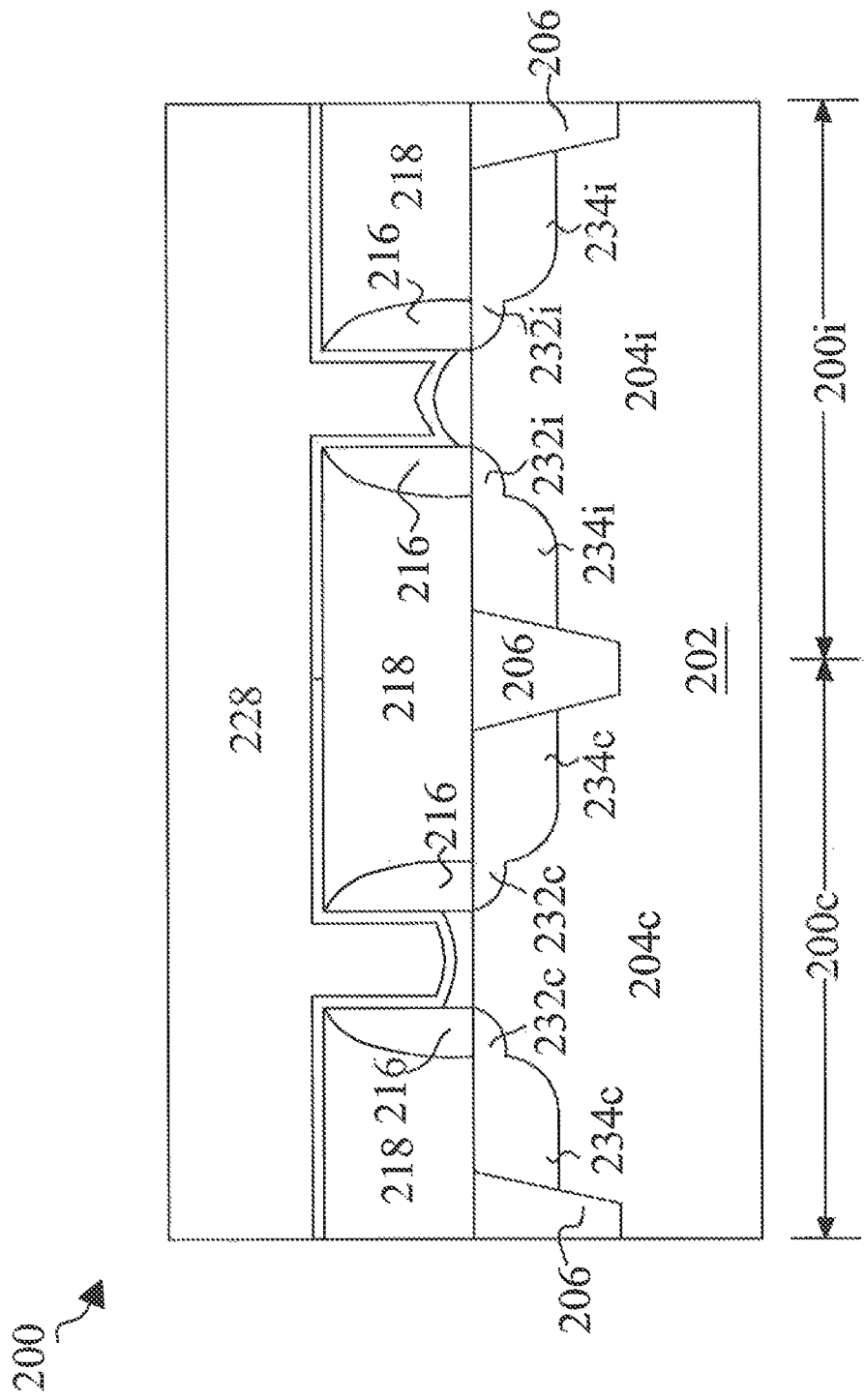
Figure 2H:
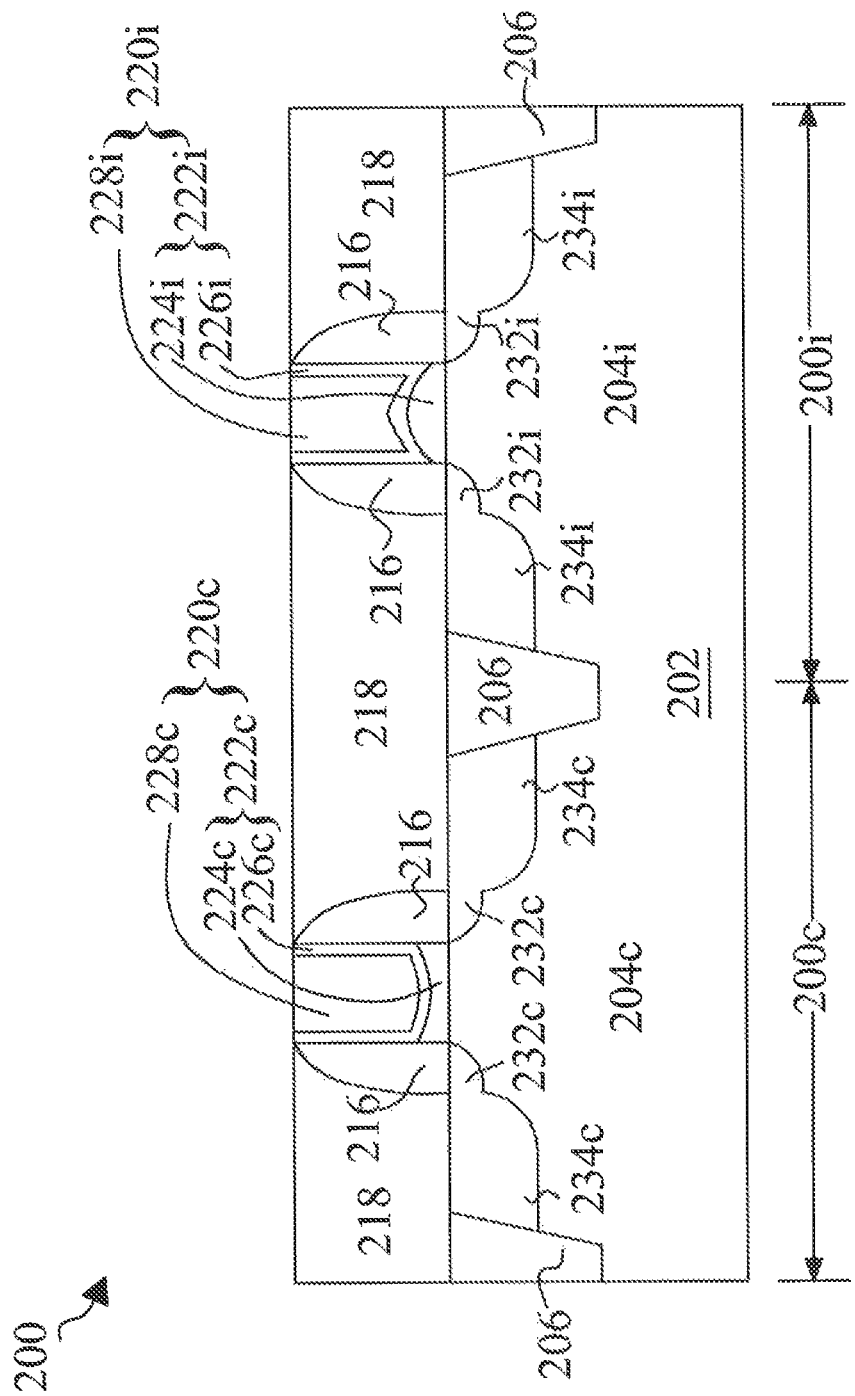

Referring to FIGS. 2A-H, illustrated are schematic cross-sectional views of a gate dielectric layer 222i of a semiconductor device 200 at various stages of fabrication according to various aspects of the present disclosure. It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 2H are simplified for a better understanding of the inventive concepts of the present disclosure. For example, although the figures illustrate a gate dielectric layer 222i for the semiconductor device 200, it is understood the integrated circuit (IC) may comprise a number of other devices comprising resistors, capacitors, inductors, fuses, etc.

Referring to FIG. 2A, a substrate 202 is provided. In one embodiment, the substrate 202 comprises a crystalline silicon substrate (e.g., wafer). The substrate 202 may include various doping configurations depending on design requirements (e.g., p-type substrate or n-type substrate). Further, the substrate 202 may include an epitaxial layer (epi layer), may be strained for performance enhancement, and/or may include a silicon-on-insulator (SOI) structure.

The substrate 202 may comprise a first active region 204i for an Input/Output (I/O) device 200i, a second active region 204c for a core device 200c and isolation regions 206. The active regions 204i/204c may include various doping configurations depending on design requirements. In some embodiments, the active regions 204i/204c may be doped with p-type or n-type dopants. For example, the active regions 204i/204c may be doped with p-type dopants, such as boron or $BF_2$; n-type dopants, such as phosphorus or arsenic; and/or combinations thereof. The active regions 204i/204c may act as regions configured for an N-type metal-oxide-semiconductor transistor device (referred to as an NMOS) and regions configured for a P-type metal-oxide-semiconductor transistor device (referred to as a PMOS).

Isolation regions 206 may be formed on the substrate 202 to isolate the various active regions 204i/204c from each other. The isolation regions 206 may utilize isolation technology, such as local oxidation of silicon (LOCOS) or shallow trench isolation (STI), to define and electrically isolate the various active regions 204i/204c. In the present embodiment, the isolation region 206 comprises an STI. The isolation regions 206 may comprise materials such as silicon oxide, silicon nitride, silicon oxynitride, fluoride-doped silicate glass (FSG), a low-k dielectric material, and/or combinations thereof. The isolation regions 206, and in the present embodiment, the STI, may be formed by any suitable process. As one example, the formation of the STI may include patterning the substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2A, a plurality of dummy gate stacks 210c/210i is then defined by sequentially depositing and patterning a dummy oxide layer 212 and a dummy gate electrode layer 214 on the substrate 202. The plurality of dummy gate stacks 210c/210i may be formed using any suitable process, including the processes described herein. In one example, the dummy oxide layer 212 and dummy gate electrode layer 214 are sequentially deposited on the substrate 202. In the present embodiment, the dummy oxide layer 212 is formed of silicon oxide grown by a thermal oxidation process, having a thickness of about 10 to 30 Å. For example, the dummy oxide layer 212 can be grown by a rapid thermal oxidation (RTO) process or in an annealing process comprising oxygen.

In some embodiments, the dummy gate electrode layer 214 may comprise a single layer or multilayer structure. In the present embodiment, the dummy gate electrode layer 214 may comprise polysilicon. Further, the dummy gate electrode layer 214 may be doped polysilicon with the same or different doping. The dummy gate electrode layer 214 comprises any suitable thickness. In the present embodiment, the dummy gate electrode layer 214 comprises a thickness in the range of about 30 nm to about 60 nm. The dummy electrode layer 214 is formed using a low-pressure chemical vapor deposition (LPCVD) process comprising silicon source gas.

Then, a layer of photoresist (not shown) is formed over the dummy gate electrode layer 214 by a suitable process, such as spin-on coating, and patterned to form a patterned photoresist feature by a proper lithography patterning method. A width of the patterned photoresist feature is in the range of about 15 to 45 nm. The patterned photoresist feature can then be transferred using a dry etching process to the underlying layers (i.e., the dummy oxide layer 212 and the dummy gate electrode layer 214) to define the plurality of dummy gate stacks 210c/210i. The photoresist layer may be stripped thereafter.

In another example, a hard mask layer (not shown) is formed over the dummy gate electrode layer 214; a patterned photoresist layer is formed on the hard mask layer; the pattern of the photoresist layer is transferred to the hard mask layer and then transferred to the dummy gate electrode layer 214 and the dummy oxide layer 212 to define the plurality of dummy gate stacks 210c/210i. It is understood that the above examples do not limit the processing steps that may be utilized to form the plurality of dummy gate stacks 210c/210i. It is further understood that the plurality of dummy gate stacks 210c/210i may comprise additional dielectric layers and/or conductive layers. For example, the plurality of dummy gate stacks 210c/210i may comprise hard mask layers, interfacial layers, capping layers, diffusion/barrier layers, other suitable layers, and/or combinations thereof.

It is noted that the semiconductor device 200 may undergo other "gate last" processes and other CMOS technology processing to form various features of the semiconductor device 200 (shown in FIG. 2B). As such, the various features are only briefly discussed herein. The various components of the semiconductor device 200 may be formed prior to formation of the gate dielectric layers 222c/222i (shown in FIGS. 2D-2H) in a "gate last" process. The various components may comprise lightly doped source/drain regions (p-type or n-type LDD) 232c/232i and source/drain regions (p-type or n-type S/D) 234c/234i in the active regions 204c/204i and on opposite sides of the plurality of dummy gate stacks 210c/210i. In the present embodiment, the p-type LDD 232c/232i and S/D 234c/234i regions may be doped with B or In, and the n-type LDD 232c/232i and S/D 234c/234i regions may be doped with P or As. The various features may further comprise pairs of gate spacers 216 and an interlayer dielectric (ILD) layer 218 on opposite sidewalls of the plurality of dummy gate stacks 210c/210i. The gate spacers 216 may be formed of silicon oxide, silicon nitride or other suitable materials. The ILD layer 218 may include an oxide formed by a high-aspect-ratio process (HARP) and/or a high-density-plasma (HDP) deposition process.

In a gate last process, the plurality of dummy gate stacks 210c/210i are removed so that a plurality of resulting gate stacks 220c/220i (shown in FIG. 2H) may be formed in place of the plurality dummy gate stacks 210c/210i. The structure in FIG. 2C is produced by removing the plurality of dummy gate stacks 210c/210i over the substrate 202 to expose surfaces 202c/202i of the substrate 202 under the plurality of dummy gate stacks 210c/210i to form openings 236c/236i. Using the pairs of gate spacers 216 as a hard-mask, the plurality of dummy gate stacks 210c/210i may be removed using a wet etch and/or a dry etch process. In an embodiment, the wet etch process for the dummy polysilicon gate electrode layer 214 comprises exposure to a hydroxide containing solution (e.g., ammonium hydroxide), deionized water, and/or other suitable etchant solutions. In other embodiments, the dry etch process for dummy polysilicon gate electrode layer 214 may be performed under a source power of about 650 to 800 W and a pressure of about 60 to 200 mTorr, using $Cl_2$, HBr and He as etching gases. And then, another wet etch process for the dummy gate oxide layer 212 comprises exposure to a HF containing solution.

In integrated circuit (IC) manufacturing, there is often a need to form transistors with different gate dielectric thicknesses on the same semiconductor substrate or wafer. For example, a thicker gate dielectric is formed in a region of the device for higher voltage requirements, e.g. an I/O region. On the other hand, a thinner gate dielectric is formed in a region of the device for lower voltage requirements, e.g. a core device region.

A process known to the inventors for forming different gate dielectric thicknesses is called a dual gate oxide (DGO) process. In a DGO process, a "thick" silicon oxide layer (e.g. for the I/O devices) is formed and a patterned photoresist is used to mask the thick silicon oxide layer in the I/O regions. The thick silicon dioxide layer is then etched away or otherwise removed from the unmasked region, where the core devices are to be formed. The patterned photoresist is removed and a thin silicon oxide layer is then grown over the core device region. The gate electrode material, typically polysilicon, is then deposited over the substrate, which at this point includes gate dielectrics of two different thicknesses. The gate electrode material and gate dielectrics are then patterned and etched to form the gate electrode and oxide stack of each transistor.

The DGO process described above has found acceptance in the industry as a manufacturable and cost effective way of producing transistors having two different gate dielectric thicknesses. However, as transistor sizes shrink there is a move in the semiconductor industry to replace traditional silicon oxide gate dielectrics with high-k dielectric material (i.e., a dielectric material with a dielectric constant greater than that of $SiO_2$), such as metal oxides. But because metal oxides cannot be thermally grown on a silicon substrate in the same manner as silicon dioxide can, there are thickness variation problems associated with multiple metal oxide depositions to form different gate dielectric thicknesses and with etching of the metal oxide, if one were to attempt to merely substitute a metal oxide for silicon oxide in a DOG process. Therefore, thickness variations of the gate dielectric layer may cause shifts in the threshold voltage of the I/O device, thereby increasing the likelihood of device instability and/or device failure.

Accordingly, the processing discussed below with reference to FIGS. 2D-2H may use a thicker interfacial layer to form a portion of a gate dielectric layer for the I/O device 200i, together with a high-k dielectric, problems associated with selective etching of the metal oxide may be avoided. This can reduce thickness variation of the gate dielectric layer in the I/O device and upgrade device performance.

Referring to FIG. 2D, after removal of the plurality of dummy gate stacks 210c/210i, a second interfacial layer 224c is formed over the surfaces 202c/202i of the substrate 202. The second interfacial layer 224c may be formed using any suitable process to any suitable thickness. In one embodiment, the second interfacial layer 224c may comprise a grown silicon oxide layer. In another embodiment, before the second interfacial layer 224c is grown over the substrate 202, an HF-last pre-gate clean (e.g., utilizing an HF solution) may be applied to the substrate 202 and followed by a second wet clean process to form a chemical oxide. In still another embodiment, the second interfacial layer 224c may be formed by rapid thermal oxidation. In one embodiment, the second interfacial layer 224c comprises silicon oxide or silicon oxynitride.

In one embodiment, the second interfacial layer 224c has a concave top surface 224a. The concave top surface 224a comprises a lowest point 224m skewed toward an edge of the concave top surface 224a. In some embodiments, the second interfacial layer 224c has a minimum thickness $t_1$ of about 0.5 nm to about 1.2 nm. In some embodiments, a ratio of a minimum thickness $t_1$ of the second interfacial layer 224c to a maximum thickness $t_2$ of the second interfacial layer 224c is from 0.6 to 0.8.

Then, a second high-k dielectric 226c is formed on the second interfacial layer 224c. A high-k dielectric material is defined as a dielectric material with a dielectric constant greater than that of $SiO_2$. The second high-k dielectric 226c comprises metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the second high-k dielectric 226c comprises a hafnium oxide. The second high-k dielectric 226c may be formed by any suitable process to any suitable thickness, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, other suitable processes, and/or combinations thereof. In one embodiment, the second high-k dielectric 226c has a thickness of about 1 nm to about 4 nm. In the present embodiment, the second interfacial layer 224c and second high-k dielectric 226c over the second active region 204c are combined and hereinafter referred to as the second gate dielectric layer 222c of the core devices 200c.

Referring to FIG. 2E, following formation of the second high-k dielectric 226c on the second interfacial layer 224c, a fluorine-containing plasma treatment 240 is performed on the second high-k dielectric 226c and the second interfacial layer 224c over the first active region 204i to form a first high-k dielectric 226i and a first interfacial layer 224i, while the second high-k dielectric layer 226c and the second interfacial layer 224c over the second active region 204c are covered by a patterned photoresist layer 242. In the present embodiment, the step of performing the fluorine-containing plasma treatment 240 is performed under a source power of about 500 to 3000 W and a pressure of about 50 mTorr to 100 mTorr, and at a temperature of about 100° C. to 350° C., using a chemical selected from $NF_3$, $CF_4$, and $SF_6$ as a fluorine source gas.

After the fluorine-containing plasma treatment 240, the photoresist layer 242 may be stripped thereafter (shown in FIG. 2F). At this point, fluorine is incorporated into the second high-k dielectric 226c and the second interfacial layer 224c over the first active region 204i, thereby changing their compositions and morphologies to form the first high-k dielectric 226i and a first interfacial layer 224i over the first active region 204i. In the present embodiment, the first high-k dielectric 226i comprises a fluorine-doped high-k dielectric. In one embodiment, a fluorine concentration of the fluorine-doped high-k dielectric is in the range of about 2% to 8% in terms of atomic percent. In another embodiment, the fluorine-doped high-k dielectric comprises fluorine-doped hafnium oxide.

In the present embodiment, the first interfacial layer 224i comprises fluorine-doped silicon oxide or fluorine-doped silicon oxynitride. In one embodiment, a fluorine concentration of the first interfacial layer 224i is in the range of about 2% to 8% in terms of atomic percent. In the present embodiment, the first interfacial layer 224i has a convex top surface 224b. The convex top surface 224b comprises a highest point 224n skewed toward an edge of the convex top surface 224b. In some embodiments, the first interfacial layer 224i has a maximum thickness $t_3$ of about 1.5 nm to about 2.5 nm. In some embodiments, a ratio of a minimum thickness $t_4$ of the first interfacial layer 224i to a maximum thickness $t_3$ of the first interfacial layer 224i is from 0.5 to 0.7.

In some embodiments, the maximum thickness $t_2$ of the second interfacial layer 224c is less than the maximum thickness t₃ of the first interfacial layer 224i. In some embodiments, a ratio of the maximum thickness $t_2$ of the second interfacial layer 224c to a maximum thickness $t_3$ of the first interfacial layer 224i is from 0.3 to 0.9. In the present embodiment, the first interfacial layer 224i and first high-k dielectric 226i over the first active region 204i are combined and hereinafter referred to as the first gate dielectric layer 222i of the I/O devices 200i.

FIG. 2G shows the substrate 202 of FIG. 2F after a metal gate electrode layer 228 may be deposited over the first high-k dielectric 226i and the second high-k dielectric 226c to completely fill the openings 236c/236i, in some embodiments, the metal gate electrode layer 228 comprises a material selected from a group of Al, Cu, TiAl, TiN, TiAlN, TiCN, TaN, TaCN, WN and WCN. In some embodiments, the metal gate electrode layer 228 has a gate length less than 32 nm in the openings 236c/236i. And then, a CMP process may be performed to planarize the metal gate electrode layer 228. The CMP process may remove a portion of the metal gate electrode layer 228, the first high-k dielectric 226i and the second high-k dielectric 226c until the top surface of the ILD layer 218 is reached (shown in FIG. 2H) The remaining portion of the metal gate electrode layer 228 in the openings 236i is referred to as a first metal gate electrode layer 228i and the remaining portion of the metal gate electrode layer 228 in the openings 236c is referred to as a second metal gate electrode layer 228c. In some embodiments, the first metal gate electrode layer 228i and second metal gate electrode layer 228c may comprise different materials and be formed in different steps.

In one embodiment, the first gate dielectric layer 222i and first metal gate electrode layer 228i are combined and hereinafter referred to as a first gate structure 220i, which is a portion of the I/O device 200i. In another embodiment, the second gate dielectric layer 222c and second metal gate electrode layer 228c are combined and hereinafter referred to as a second gate structure 220c, which is a portion of the core device 200c. As such, the semiconductor device 200 comprises a substrate 202 having a first active region 204i; a first gate structure 220i over the first active region 204i, wherein the first gate structure 200i comprises a first interfacial layer 224i having a convex top surface 224b; a first high-k dielectric 226i over the first interfacial layer 224i; a first gate electrode 228i over the first high-k dielectric 226i; a second gate structure 220c over a second active region 204c, wherein the second gate structure 220c comprises a second interfacial layer 224c having a concave top surface 224a; a second high-k dielectric 226c over the second interfacial layer 224c; and a second gate electrode 228c over the second high-k dielectric 226c.

Applicant's method uses a thicker interfacial layer 224i to form a portion of a gate dielectric layer 222i for the I/O device 200i, together with a high-k dielectric 226i, and thus problems associated with selective etching of the metal oxide may be avoided. This can reduce thickness variations of the gate dielectric layer 222i in the I/O device 200i and upgrade device performance.

It is understood that the semiconductor device 200 may undergo further CMOS processes to form various features such as contacts/vias, interconnect metal layers, dielectric layers, passivation layers, etc.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
   a substrate having a first active region, wherein the first active region has a planar top surface;
   a first gate structure over the first active region, wherein the first gate structure comprises
   a first interfacial layer, wherein an entirety of a top surface of the first interfacial layer is a curved convex surface;
   a first high-k dielectric over the first interfacial layer; and
   a first gate electrode over a first portion of the first high-k dielectric and surrounded by a second portion of the first high-k dielectric.

2. The semiconductor device of claim 1, wherein the first interfacial layer comprises fluorine-doped silicon oxide or fluorine-doped silicon oxynitride.

3. The semiconductor device of claim 2, wherein a fluorine concentration of the first interfacial layer is in the range of about 2% to 8% in terms of atomic percent.

4. The semiconductor device of claim 1, wherein the convex top surface comprises a highest point skewed toward an edge of the convex top surface.

5. The semiconductor device of claim 1, wherein a ratio of a minimum thickness of the first interfacial layer to a maximum thickness of the first interfacial layer is from 0.5 to 0.7.

6. The semiconductor device of claim 1, wherein the first high-k dielectric comprises a fluorine-doped high-k dielectric.

7. The semiconductor device of claim 6, wherein a fluorine concentration of the fluorine-doped high-k dielectric is in the range of about 2% to 8% in terms of atomic percent.

8. The semiconductor device of claim 6, wherein the fluorine-doped high-k dielectric comprises fluorine-doped hafnium oxide.

9. The semiconductor device of claim 1 further comprising a second gate structure over a second active region, wherein the second gate structure comprises
   a second interfacial layer having a concave top surface;
   a second high-k dielectric over the second interfacial layer; and
   a second gate electrode over the second high-k dielectric.

10. The semiconductor device of claim 9, wherein the second interfacial layer comprises silicon oxide or silicon oxynitride.

11. The semiconductor device of claim 9, wherein the concave top surface comprises a lowest point skewed toward an edge of the concave top surface.

12. The semiconductor device of claim 9, wherein a ratio of a minimum thickness of the second interfacial layer to a maximum thickness of the second interfacial layer is from 0.6 to 0.8.

13. The semiconductor device of claim 9, wherein a maximum thickness of the second interfacial layer is less than a maximum thickness of the first interfacial layer.

14. The semiconductor device of claim 13, wherein a ratio of the maximum thickness of the second interfacial layer to the maximum thickness of the first interfacial layer is from 0.3 to 0.9.

15. The semiconductor device of claim 9, wherein the first gate structure is a portion of an input/output (I/O) device and the second gate structure is a portion of a core device.

16. A semiconductor device, comprising:
   a substrate having an active region, wherein the active region has a planar top surface; and
   a gate structure over the active region, wherein the gate structure comprises:

an interfacial layer, the interfacial layer comprises fluorine dopants;

a high-k dielectric over the interfacial layer, wherein an entirety of a top surface of the first interfacial layer is a curved convex surface; and a gate electrode over a first portion of the high-k dielectric and surrounded by a second portion of the high-k dielectric.

17. The semiconductor device of claim 16, wherein the high-k dielectric comprises a fluorine-doped high-k dielectric.

18. The semiconductor device of claim 17, wherein
a fluorine concentration of the interfacial layer is in the range of about 2% to 8% in terms of atomic percent, and
a fluorine concentration of the fluorine-doped high-k dielectric is in the range of about 2% to 8% in terms of atomic percent.

19. A semiconductor device, comprising:
a substrate having a first active region and a second active region, wherein the first active region and the second active region have a planar top surface;
a first gate structure over the first active region; and
a second gate structure over the second active region, wherein
the first gate structure comprises:
a first interfacial layer, the first interfacial layer comprises fluorine dopants, wherein an entirety of a top surface of the first interfacial layer is a curved convex surface;
a first high-k dielectric over the first interfacial layer; and
a first gate electrode over the first high-k dielectric; and
the second gate structure comprises:
a second interfacial layer having a concave top surface;
a second high-k dielectric over the second interfacial layer; and
a second gate electrode over a first portion of the second high-k dielectric and surrounded by a second portion of the second high-k dielectric.

20. The semiconductor device of claim 19, wherein the first high-k dielectric comprises a fluorine-doped high-k dielectric, a fluorine concentration of the first interfacial layer is in the range of about 2% to 8% in terms of atomic percent, and
a fluorine concentration of the fluorine-doped high-k dielectric is in the range of about 2% to 8% in terms of atomic percent.

21. The semiconductor device of claim 19, wherein a ratio of a minimum thickness of the first interfacial layer to a maximum thickness of the first interfacial layer is from 0.5 to 0.7.

* * * * *